(12) United States Patent
Kondo

(10) Patent No.: US 9,178,469 B2
(45) Date of Patent: Nov. 3, 2015

(54) RESONATION DEVICE, ELECTRONIC APPARATUS, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/220,587

(22) Filed: Mar. 20, 2014

(65) Prior Publication Data

US 2014/0292422 A1    Oct. 2, 2014

(30) Foreign Application Priority Data

Mar. 29, 2013    (JP) .................... 2013-071575

(51) Int. Cl.
   *H03H 9/05*    (2006.01)
   *H03B 5/30*    (2006.01)
   *H03H 9/10*    (2006.01)

(52) U.S. Cl.
   CPC ............... *H03B 5/30* (2013.01); *H03H 9/0552* (2013.01); *H03H 9/1021* (2013.01)

(58) Field of Classification Search
   CPC ...................................................... H03H 9/05

USPC .................. 331/66, 68, 69, 70, 158; 310/343; 29/840

See application file for complete search history.

(56) References Cited

U.S. PATENT DOCUMENTS

| 8,022,777 | B2 * | 9/2011 | Stolpman et al. ............... 331/70 |
| 2006/0290239 | A1 | 12/2006 | Kasahara et al. |
| 2009/0256641 | A1 * | 10/2009 | Lee et al. ....................... 331/66 |

FOREIGN PATENT DOCUMENTS

| JP | 2001-500715 | 1/2001 |
| JP | 2007-006270 | 1/2007 |
| WO | WO 99/65087 | 12/1999 |

* cited by examiner

*Primary Examiner* — Joseph Chang
(74) *Attorney, Agent, or Firm* — Oliff PLC

(57) ABSTRACT

A quartz crystal oscillator as a resonation device includes a substrate, a quartz crystal resonator as a resonator attached with a heating element, terminals adapted to fix the resonator and the substrate to each other, and intermediate members having an electrical insulation property and lower in thermal conductivity than the terminals. The intermediate members intervene between the resonator and the substrate via the terminals, and a gap is disposed between the quartz crystal resonator and the substrate.

12 Claims, 6 Drawing Sheets

RESONATION DEVICE, ELECTRONIC APPARATUS, AND MOVING OBJECT

BACKGROUND

1. Technical Field

The present invention relates to a resonation device, and an electronic apparatus and a moving object each equipped with a resonation device.

2. Related Art

Since quartz crystal oscillators vary in frequency with a variation in temperature, there are used constant-temperature quartz crystal oscillators in which the temperature of the quartz crystal resonator is maintained at a constant level by heating the quartz crystal resonator using a heating element such as a heater. In such a constant-temperature crystal oscillator, if the quartz crystal resonator is directly mounted on a substrate constituting a part of a thermostatic chamber, the heat of the quartz crystal resonator and the heating element is released to the substrate. Therefore, it becomes difficult to keep the temperature of the quartz crystal resonator constant. Further, if it is attempted to keep the temperature of the quartz crystal resonator constant, a larger amount of power must be supplied to the heating element, and therefore, there is a problem that the power consumption increases.

In order to solve the problem described above, in JP-A-2007-6270 (Document 1), there is disclosed a structure in which a gap is disposed between the substrate and the quartz crystal resonator in connecting/fixing the quartz crystal resonator provided with the heating element and the substrate to each other with a lead wire.

In such a configuration according to Document 1, the gap is disposed between the substrate and the quartz crystal resonator to thereby inhibit the heat of the quartz crystal resonator from being released to the substrate. However, since the lead wire performs both of the electrical connection and the mechanical fixation between the quartz crystal resonator and the substrate, the connection between the quartz crystal resonator and the substrate is achieved by the plate-like lead wire having mechanical strength and silver solder. Since the lead wire and the silver solder are high in thermal conductivity, the heat is released from the quartz crystal resonator to the substrate via the lead wire. Therefore, since the heat is easily released from the quartz crystal resonator, the power consumption increases, and it is difficult to reduce the power consumption.

SUMMARY

An advantage of some aspects of the invention is to solve at least a part of the problems described above, and the invention can be implemented as the following aspects and application examples.

APPLICATION EXAMPLE 1

This application example is directed to a resonation device including a substrate, a resonator, a heating element adapted to heat the resonator, a terminal adapted to connect the resonator and the substrate to each other, and an intermediate member lower in thermal conductivity than the terminal disposed at least one of between the resonator and the terminal, and between the terminal and the substrate.

The resonation device keeps constant temperature in order to suppress the frequency variation due to the temperature variation by heating the resonator using the heating element. In the case in which the heat of the resonator is easy to be released to the substrate, the power to be supplied to the heating element for keeping the temperature of the resonator constant is increased. Therefore, by disposing the intermediate member lower in thermal conductivity than the terminal between the resonator and the substrate, the heat can be inhibited from being released from the resonator to the substrate. As a result, the power supply to the heating element for keeping the temperature of the resonator constant can be reduced, and thus, the frequency stability of the resonator can be improved while achieving the reduction of the power consumption.

APPLICATION EXAMPLE 2

In the resonation device according to the application example described above, it is preferable that the intermediate member is an insulating member, and the resonator and the substrate are electrically connected to each other with the terminal and an electrically-conductive connection material lower in thermal conductivity than the terminal.

According to the configuration described above, since the mechanical fixation between the resonator and the substrate is achieved using the terminal, it is sufficient for the electrically-conductive connection material to achieve only the electrical connection between the resonator and the substrate. Therefore, by reducing the cross-sectional area of the heat transfer path so as to lower the thermal conductivity of the electrically-conductive connection material, the heat can be inhibited from being released from the resonator to the substrate.

APPLICATION EXAMPLES 3 AND 4

In the resonation device according to the application example described above, it is preferable that the intermediate members are respectively disposed between the resonator and the terminal, and between the terminal and the substrate.

According to the configuration described above, the intermediate members lower in thermal conductivity than the terminal respectively intervene between the resonator and the terminal, and between the terminal and the substrate. Therefore, the heat can further be inhibited from being released from the resonator to the substrate, and at the same time, the external heat can also be inhibited from being transferred to the resonator.

APPLICATION EXAMPLES 5 AND 6

In the resonation device according to the application example described above, it is preferable that the intermediate member is lower in thermal conductivity than the resonator in a case in which the intermediate member is disposed between the resonator and the terminal, and the intermediate member is lower in thermal conductivity than the substrate in a case in which the intermediate member is disposed between the terminal and the substrate.

According to the configuration described above, since the thermal conductivity of the intermediate member is lower than the thermal conductivity of the constituent (the substrate or the resonator) having contact with the intermediate member, the heat is difficult to be transferred from the resonator to the terminal via the intermediate member, or the heat is difficult to be transferred from the terminal to the substrate via the intermediate member compared to the case of directly connecting the terminal to the resonator and the substrate. Therefore, the heat can further be inhibited from being released from the resonator to the substrate, and at the same time, the external heat can also be inhibited from being transferred to the resonator.

APPLICATION EXAMPLES 7 AND 8

In the resonation device according to the application example described above, it is preferable that the intermediate members are lower in thermal conductivity than at least one of the substrate and the resonator.

According to the configuration described above, since the thermal conductivity of the intermediate member is lower than the thermal conductivity of at least one of the substrate and the resonator, the heat is difficult to be transferred from the resonator to the terminal via the intermediate member, or the heat is difficult to be transferred from the terminal to the substrate via the intermediate member compared to the case of directly connecting the terminal to the resonator and the substrate. Therefore, the heat can further be inhibited from being released from the resonator to the substrate, and at the same time, the external heat can also be inhibited from being transferred to the resonator.

APPLICATION EXAMPLE 9

In the resonation device according to the application example described above, it is preferable that the electrically-conductive connection material is a metal wire.

As the metal wire, there can be adopted, for example, a bonding wire, which is a thin wire with a diameter in a range of about 20 through 50 μm. Therefore, since the cross-sectional area is small despite the metal wire, the heat transfer in the electrical connection section can be suppressed.

APPLICATION EXAMPLE 10

In the resonation device according to the application example described above, it is preferable that the electrically-conductive connection material is an electrically-conductive adhesive.

Here, as the electrically-conductive adhesive, there can be cited, for example, a thermosetting electrically-conductive epoxy adhesive. By using such a connection material, the connection area can be limited to a range in which the electrical connection is achievable using a dispenser or the like when applying the adhesive, and therefore, the heat transfer in the electrical connection section can be suppressed.

APPLICATION EXAMPLE 11

This application example is directed to an electronic apparatus including the resonation device described above.

According to such an electronic apparatus as described above, it is possible to provide an electronic apparatus, which can keep the resonator at predetermined temperature with low power consumption, and is so accurate that the frequency is difficult to vary in accordance with the temperature variation.

APPLICATION EXAMPLE 12

This application example is directed to a moving object including the resonation device described above.

In most cases, moving objects are used in an environment with a significant temperature variation. Therefore, by installing the resonation device described above in the moving object, it is possible to keep the resonator at predetermined temperature with low power consumption. Therefore, it is possible to realize the moving object provided with reliability so high that the frequency does not vary despite the variation in external temperature.

BRIEF DESCRIPTION OF THE DRAWINGS

The invention will be described with reference to the accompanying drawings, wherein like numbers reference like elements.

FIGS. 6A and 6B are diagrams showing a connection structure between a terminal and a substrate according to a fourth embodiment of the invention, wherein FIG. 6A is a partial plan view, and FIG. 6B is a partial cross-sectional view showing an A-A cut surface in FIG. 6A.

FIGS. 7A through 7C are diagrams showing a connection structure between a terminal and a substrate according to a fifth embodiment of the invention, wherein FIG. 7A is a partial plan view, FIG. 7B is a partial cross-sectional view showing an A-A cut surface in FIG. 7A, and FIG. 7C is a partial cross-sectional view showing a modified example of the fifth embodiment.

DESCRIPTION OF EXEMPLARY EMBODIMENTS

Some embodiments of the invention will hereinafter be explained with reference to the accompanying drawings.

It should be noted that the resonation device according to each of the embodiments described hereinafter will be explained showing a configuration of a quartz crystal oscillator 1, which uses a quartz crystal resonator 10 as a resonator, as an example.

Further, the drawings referred to in the following explanation are schematic diagrams having contraction scales in the vertical and horizontal directions and the thickness of each of the constituents or the parts different from the actual ones in order for providing the constituents with recognizable sizes.

Resonation Device

First Embodiment

Figure 1:
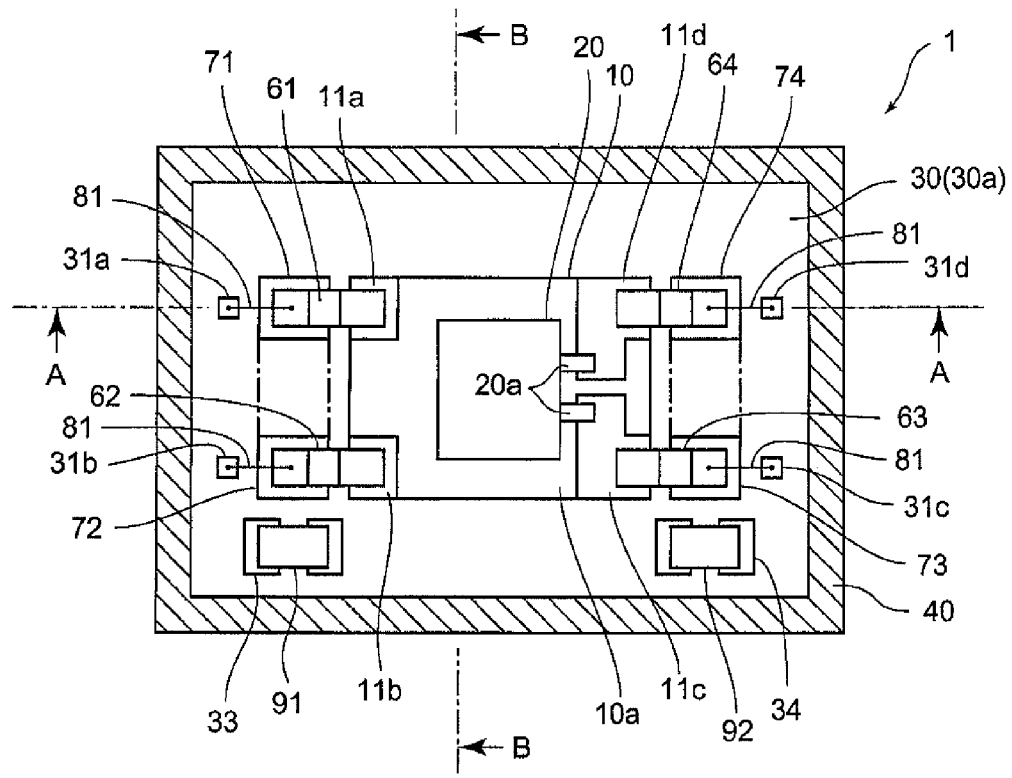
FIG. 1 is a plan view showing an internal structure of a quartz crystal oscillator as a resonation device according to a first embodiment of the invention.
Figure 2:
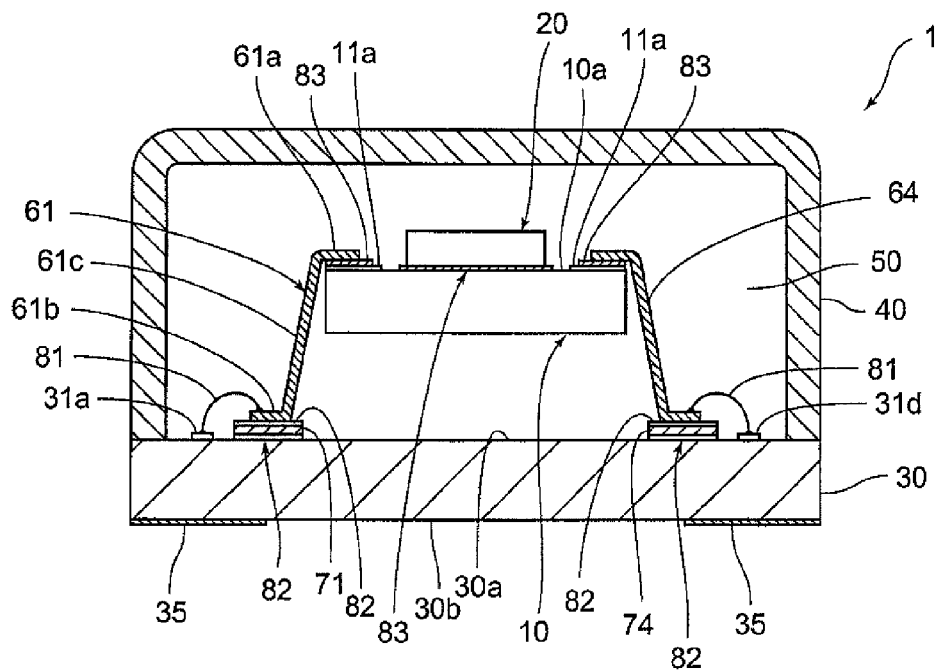
FIG. 2 is a cross-sectional view showing an A-A cut surface in FIG. 1.
Figure 3:
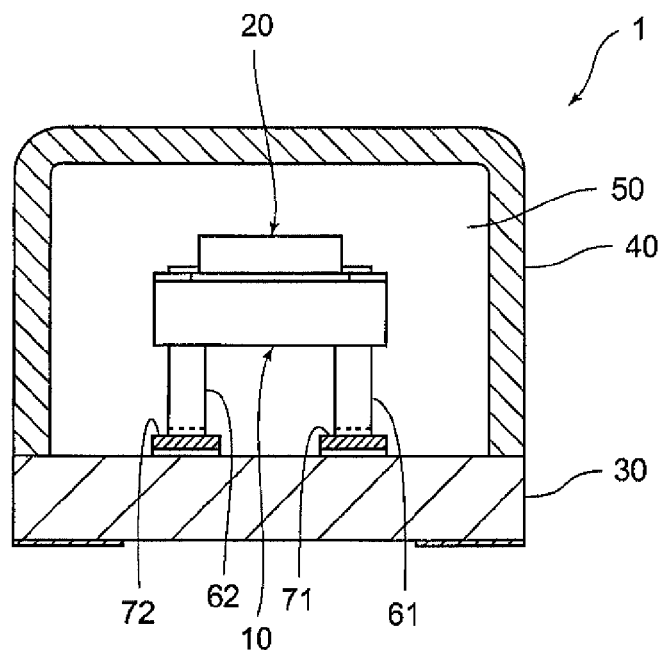
FIG. 3 is a cross-sectional view showing a B-B cut surface in FIG. 1.

FIG. 1 is a plan view showing an internal structure of the quartz crystal oscillator 1 as the resonation device according to a first embodiment, FIG. 2 is a cross-sectional view showing an A-A out surface in FIG. 1, and FIG. 3 is a cross-sectional view showing a B-B cut surface in FIG. 1. As shown in FIGS. 1 through 3, the quartz crystal oscillator 1 is provided with a quartz crystal resonator 10 as the resonator housed in a space 50 surrounded by a substrate 30 and a lid member 40. A heating element 20 is connected to a central portion of a principal surface 10a of the quartz crystal resonator 10 using an electrically-conductive connection material 83. The quartz crystal resonator 10 and the heating element 20 are separated from the outside with the substrate 30 and the lid member 40.

It should be noted that the connection material used for the connection of the heating element 20 is not limited to the electrically-conductive connection material 83, but can be any connection material high in thermal conductivity in order to make the heat of the heating element 20 easy to transfer to the quartz crystal resonator 10.

The quartz crystal resonator 10 and the substrate 30 are connected (mechanically connected) to each other with four terminals 61, 62, 63, and 64 (hereinafter collectively referred to as terminals 60) so as to keep a gap in a thickness direction of the quartz crystal oscillator 1. It is preferable for the gap to be configured to have a distance with which the quartz crystal resonator 10 and the substrate 30 are difficult to be affected by the mutual radiation heat.

Although not shown in the drawings, the quartz crystal resonator 10 is composed of a quartz crystal resonator element provided with a pair of excitation electrodes, and a ceramic package for airtightly housing the quartz crystal resonator element. Connecting electrodes 11a, 11b, 11c, and 11d are disposed respectively on the four corners of the principal surface 10a of the quartz crystal resonator 10. It should be noted that the connecting electrodes 11a, 11b, 11c, and 11d are expressed collectively as connecting electrodes 11. The connecting electrodes 11 are electrically connected to the pair of excitation electrodes of the quartz crystal resonator element. The substrate 30 (the principal surface 30a) in the space 50 surrounded by the substrate 30 and the lid member 40 is provided with an oscillator circuit 91 and a heating element control circuit 92.

The heating element 20 is an element including a power transistor as a heater and a temperature-sensitive element (a thermosensor), wherein element electrodes 20a for electrical connection are disposed on a side surface of the element, and are connected to the connecting electrodes 11 formed on the principal surface 10a of the quartz crystal resonator 1 with a bonding material such as an adhesive having a good thermal conductive property or solder. It should be noted that the power transistor and the temperature-sensitive element can be formed as respective chips separated from each other, or a resistance heating element can be used instead of the power transistor. Further, the heating element 20 can be connected to the substrate 30 using wire bonding or the like without intervention of the wiring lines formed on the principal surface of the quartz crystal resonator 10. Further, the temperature-sensitive element can be provided to the heating element control circuit 92.

The substrate 30 is a circuit board formed of glass epoxy resin, ceramics, or the like, and electrodes and a wiring pattern not shown are formed on the principal surface 30a and a reverse surface 30b. Connecting electrodes 31a, 31b, 31c, and 31d for achieving electrical connection to the quartz crystal resonator 10, and element electrodes 33, 34 to which the oscillator circuit 91 and the heating element control circuit 92 are respectively connected are disposed on the principal surface 30a. Further, on the reverse surface 30b of the substrate 30, there are disposed external electrodes 35 for connecting the quartz crystal oscillator 1 to the equipment on which the quartz crystal oscillator 1 is mounted.

On the principal surface 30a of the substrate 30, there is disposed an intermediate member 71, and the intermediate member 71 is located between the quartz crystal resonator 10 and the connecting electrode 31a in FIG. 1. Similarly, an intermediate member 72 is disposed between the quartz crystal resonator 10 and the connecting electrode 31b, an intermediate member 73 is disposed between the quartz crystal resonator 10 and the connecting electrode 31c, and an intermediate member 74 is disposed between the quartz crystal resonator 10 and the connecting electrode 31d. Hereinafter, the intermediate members 71, 72, 73, and 74 are collectively described as intermediate members 70.

The intermediate members 70 are each a plate member or a rectangular parallelepiped formed of a material lower in thermal conductivity than metal and having electrical insulation property such as glass, glass epoxy resin, ceramics such as alumina, or polyimide resin. In the present embodiment, these intermediate members 70 are assumed to be formed of a material lower in thermal conductivity than at least the terminals 60. The intermediate members 70 are each connected to a predetermined position on the principal surface 30a of the substrate 30 using an insulating connection material 82. As the insulating connection material 82, an epoxy adhesive, for example, is used.

It should be noted that as the material of the intermediate members 70, an electrically-conductive material can be selected providing the thermal conductivity is lower than that of the terminals 60.

Further, the intermediate members 70 can be lower in thermal conductivity than the substrate 30.

Further, in the intermediate members 70, the intermediate member 71 and the intermediate member 72, and the intermediate member 73 and the intermediate member 74 can each be integrated, the intermediate member 71 and the intermediate member 74, and the intermediate member 72 and the intermediate member 73 can each be integrated, and further, a configuration of integrating the four intermediate members with each other can also be adopted.

Further, each of the intermediate members 70 and the insulating connection material 82 can be formed of the same member, and formation of the intermediate members 70 and connection of the intermediate members 70 to the principal surface 30a can be performed at the same time.

The oscillator circuit 91 includes an oscillating circuit section and an amplifying circuit section. The quartz crystal resonator 10, the oscillating circuit section, and the amplifying circuit section constitutes an oscillation circuit. The oscillation circuit of the present embodiment is a feedback oscillation circuit in which the quartz crystal resonator 10 is oscillated by the oscillating circuit section, the oscillation output is amplified by the amplifying circuit section, and the result is partially fed back to the oscillating circuit section, and an output signal with an accurate frequency is output from the quartz crystal oscillator 1. It should be noted that the oscillator circuit 91 can include a frequency temperature compensation circuit for compensating the frequency-temperature characteristic.

The heating element control circuit 92 includes a temperature control circuit for controlling the temperature of the quartz crystal resonator 10 so as to be increased to and then kept in predetermined temperature by controlling the supply power to the heating element 20 based on the detection output of the temperature-sensitive element.

The terminals 60 is each a thin plate-like metal member formed of a material such as kovar or 42Alloy. The terminals 60 are each formed to be bent. The terminal 61 will be explained as a representative example with reference to FIG. 2. The terminal 61 is a thin plate-like metal member having three sections, namely a fixation end section 61a as a connection section bent so as to be connected to the quartz crystal resonator 10, a fixation end section 61b as a connection section bent so as to be connected to the substrate 30, and an intermediate connection section 61c connecting the fixation end section 61a and the fixation end section 61b to each other, formed integrally.

Then, a connection structure between the quartz crystal resonator 10 and the heating element 20, and the substrate 30 will be explained. It should be noted that although the quartz crystal resonator 10 is connected to the substrate with the terminals 60, the connection structure using the terminals 60 will be explained using the terminal 61 as a representative example with reference to FIGS. 1 and 2. The terminal 61 is fixed to the surface of the connecting electrode 11a provided to the quartz crystal resonator 10 in the fixation end section 61a using the electrically-conductive connection material 83. As the electrically-conductive connection material 83, there is used, for example, an electrically-conductive epoxy adhesive obtained by mixing metal particles or metal filler made of silver, copper, aluminum, and so on in epoxy resin, or solder. Therefore, the quartz crystal resonator 10 and the terminal 61 are electrically connected to each other.

As shown in FIG. 2, the terminal 61 is connected to the intermediate member 71 in the fixation end section 61b using the insulating connection material 82. In general, insulating materials are low in thermal conductivity compared to electrical conductor. Therefore, since the insulating connection material 82 intervenes between the intermediate member 71 and the principal surface 30a, and between the intermediate member 71 and the terminal 61, it results that the heat transfer is suppressed between the intermediate member 71 and the principal surface 30a, and between the intermediate member 71 and the terminal 61. As is explained hereinabove, the terminal 61 and the substrate 30 are connected to each other with a low thermal conductivity layer intervening in between, the low thermal conductivity layer having a three-layer structure having the insulating connection material 82, the intermediate member 71, and the insulating connection material 82 stacked on each other from the principal surface 30a side in this order. Therefore, a structure difficult for the heat to be transferred can be obtained between the quartz crystal resonator 10 and the substrate 30.

Further, if a configuration in which the thermal conductivity of the intermediate member 71 is lower than the thermal conductivity of the substrate 30 is adopted, since the intermediate member 71 lower in thermal conductivity than the substrate 30 intervenes between the fixation end section 61b of the terminal 61 and the substrate 30, the heat of the terminal 61 becomes difficult to be transferred to the substrate 30 compared to the case in which the fixation end section 61b of the terminal 61 and the substrate 30 are directly connected to each other. Therefore, a structure more difficult for the heat to be transferred can be obtained between the quartz crystal resonator 10 and the substrate 30.

It should be noted that the connection between the fixation end section 61b and the intermediate member 71 can also be performed so that the periphery of the fixation end section 61b is surrounded by the insulating connection material 82 in the state in which the fixation end section 61b and the intermediate member 71 have contact with each other.

As shown in FIGS. 1 and 2, regarding the electrical connection between the quartz crystal resonator 10 and the substrate 30, each of a connection between the terminal 61 and the connecting electrode 31a, a connection between the terminal 62 and the connecting electrode 31b, a connection between the terminal 63 and the connecting electrode 31c, and a connection between the terminal 64 and the connecting electrode 31d is achieved by a metal wire 81. The metal wire 81 is a bonding wire.

As shown in FIGS. 1 and 3, the heating element 20 and the substrate 30 are electrically connected to each other via the element electrodes 20a for the electrical connection of the heating element 20, the quartz crystal resonator 10, and the terminals 60.

It is known that the resonator such as the quartz crystal resonator 10 varies in resonant frequency with the temperature variation. The frequency-temperature curve of the quartz crystal resonator 10 is expressed by a quadratic or cubic curve having temperature at which the frequency variation takes a minimal value. Therefore, by keeping the temperature of the quartz crystal resonator 10 in the vicinity of the temperature at which the frequency variation takes the minimal value, the quartz crystal oscillator 1 small in resonance frequency variation can be realized. The quartz crystal oscillator 1 according to the present embodiment is a device, which keeps the quartz crystal resonator 10 at constant temperature by heating the quartz crystal resonator 10 to the predetermined temperature using the heating element 20 in order to suppress the resonant frequency variation due to the temperature variation.

Such a resonation device as described above is called a constant-temperature resonation device (a constant-temperature crystal oscillator).

The quartz crystal resonator 10 is heated by the heating element 20 to thereby be kept at constant temperature in order to suppress the frequency variation due to the temperature variation. In the case in which the heat of the quartz crystal resonator 10 is easy to be released to the substrate 30, the power to be supplied to the heating element 20 for keeping the temperature of the quartz crystal resonator 10 constant is increased. Therefore, by making the intermediate member 70 lower in thermal conductivity than the terminals 60 intervene between the quartz crystal resonator 10 and the substrate 30, the heat is inhibited from being transferred between the quartz crystal resonator 10 and the substrate 30. As a result, since the heat can be inhibited from being released from the quartz crystal resonator 10, the temperature of the quartz crystal resonator 10 can be kept constant even if the power supply to the heating element 20 is reduced, and thus, it is possible to enhance the frequency stability of the resonator, and at the same time to achieve reduction of the power consumption.

Further, in the present embodiment, the quartz crystal resonator 10 and the substrate 30 are electrically connected to each other via the terminals 60 and the electrically-conductive connection material. In the electrical connection configuration, since it is sufficient to mechanically connect the quartz crystal resonator 10 and the substrate 30 to each other with the terminals 60 to thereby obtain the rigidity, and further electrically connect the quartz crystal resonator 10 and the substrate 30 to each other with the electrically-conductive connection material, it is possible to suppress the heat transfer from the resonator to the substrate by reducing the cross-sectional area of the heat-transfer path. In the present embodiment, the metal wire 81 is used as the electrically-conductive connection material. Since the metal wire 81 is a thin wire having a diameter in a range of about 20 through 50 μm, the cross-sectional area of the heat-transfer path is small, and thus, the heat transfer from the quartz crystal resonator 10 to the substrate 30 can be suppressed.

Further, the intermediate members 70 are made to intervene between the substrate 30 and the terminals 60. By adopting such a configuration, the heat of the quartz crystal resonator 10 can be inhibited from being released to the substrate 30 via the terminals 60. Further, by providing the intermediate members 70 near to the substrate 30, the heat from the outside can be inhibited from being transferred to the quartz crystal resonator 10.

Further, the connection between the substrate 30 and the intermediate members 70, and the connection between the terminals 60 and the intermediate members 70 are achieved by the connection material (the insulating connection material 82) such as an epoxy adhesive lower in thermal conductivity than the terminals 60. By adopting such a configuration as described above, the heat transfer can be suppressed in the connection section between the intermediate members 70 and the substrate 30, and the connection section between the terminals 60 and the intermediate members 70.

It should be noted that in the case in which a sufficient heat-insulating effect is obtained by, for example, thickening the intermediate members 70, it is possible to use a connection material other than the insulating connection material 82.

It should be noted that in the present embodiment, the quartz crystal resonator 10 is used as the resonator. Although the quartz crystal resonator 10 is superior in frequency-temperature characteristic to resonators other than the quartz crystal resonator, the constant-temperature type provided with the heating element is adopted in order to further improve the accuracy. Therefore, by adopting the configuration described above, the temperature of the quartz crystal resonator can be kept constant, and thus, the resonation device such as the quartz crystal oscillator high in accuracy and low in power consumption can be realized.

Resonation Device

Second Embodiment

Then, a second embodiment of the invention will be explained with reference to FIG. 4. The second embodiment is characterized in that the intermediate members 71, 75 are disposed on both of the substrate 30 side and the quartz crystal resonator 10 side. The parts common to the first embodiment and the second embodiment are denoted with the same reference numerals as those in the first embodiment, and the parts different from the first embodiment will mainly be explained.

Figure 4:
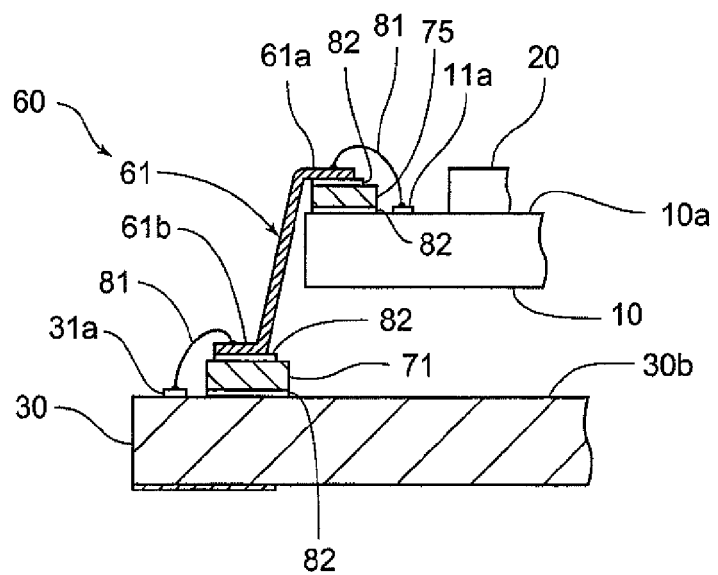
FIG. 4 is a partial cross-sectional view showing a connection section of a terminal according to a second embodiment of the invention.

FIG. 4 is a partial cross-sectional view showing a connection section of the terminals 60 according to the second embodiment. The terminal 61 will be explained as a representative example. It should be noted that the fixation structure and the connection structure on the substrate 30 side are common to the first embodiment and the second embodiment, and the explanation thereof will be omitted.

As shown in FIG. 4, on the quartz crystal resonator 10 side, the intermediate member 75 is connected to the principal surface 10a of the quartz crystal resonator 10 with the insulating connection material 82. The terminal 61 is connected to the intermediate member 75 in the fixation end section 61a using the insulating connection material 82. As the material of the intermediate member 75 and the insulating connection material 82, the same materials used in the first embodiment can be used.

The quartz crystal resonator 10 and the terminal 61 are electrically connected to each other between the connecting electrode 11a provided to the quartz crystal resonator 10 and the terminal 61 (the fixation end 61a) with the metal wire 81.

As described above, also on the quartz crystal resonator 10 side in addition to the substrate 30 side, the connection is achieved by making the heat-insulating layer intervene, which has the three-layer structure composed of the insulating connection material 82, the intermediate member 75, and the insulating connection material 82 stacked on each other in this order from the principal surface 10a side. Therefore, it is possible to make the heat difficult to be transferred between the quartz crystal resonator 10 and the terminals 60, and between the terminals 60 and the substrate 30 to thereby further suppress the release of the heat from the quartz crystal resonator 10 to the substrate 30, and the transfer of the heat from the outside to the quartz crystal resonator 10 via the substrate 30.

It should be noted that it is also possible to adopt a structure in which the terminal 61 is directly connected to the quartz crystal resonator 10 using the insulating connection material 82, and the fixation end section 61a of the terminal 61 and the connecting electrode 11a are connected to each other with the metal wire 81. On this occasion, as the insulating connection material 82, there is used a material having a thermal conductivity equivalent to that of the intermediate member 75, or a material having a thermal conductivity lower than that of the intermediate member 75.

Further, the thermal conductivity of the intermediate member 75 can be lower than the thermal conductivity of the quartz crystal resonator 10. By adopting such a configuration, since the intermediate member 75 lower in thermal conductivity than the quartz crystal resonator 10 intervenes between the fixation end section 61a of the terminal 61 and the quartz crystal resonator 10, the heat of the quartz crystal resonator 10 becomes difficult to be transferred to the terminal 61 compared to the case of directly connecting the fixation end section 61a of the terminal 61 and the quartz crystal resonator 10 to each other. Therefore, a structure more difficult for the heat to be transferred can be obtained between the quartz crystal resonator 10 and the substrate 30.

Further, in the case in which the intermediate member 71 exists between the substrate 30 and the fixation end section 61b, and the intermediate member 75 exists between the quartz crystal resonator 10 and the fixation end section 61a as shown in FIG. 4, it is also possible to arrange that the intermediate member 71 and the intermediate member 75 have a thermal conductivity lower than the thermal conductivity of at least one of the substrate 30 and the quartz crystal resonator 10. By adopting such a configuration as described above, since the intermediate member 71 lower in thermal conductivity than the substrate 30 intervenes between the substrate 30 and the fixation end section 61b, the heat of the terminal 61 becomes difficult to be transferred to the substrate 30 compared to the case of directly connecting the substrate 30 and the fixation end section 61b to each other, or since the intermediate member 75 lower in thermal conductivity than the quartz crystal resonator 10 intervenes between the quartz crystal resonator 10 and the fixation end section 61a, the heat of the quartz crystal resonator 10 becomes difficult to be transferred to the terminal 61 compared to the case of directly connecting the quartz crystal resonator 10 and the fixation end section 61a to each other. Therefore, a structure difficult for the heat to be transferred can be obtained between the quartz crystal resonator 10 and the substrate 30.

Further, it is also possible to adopt a structure in which the intermediate member 75 is disposed only on the quartz crystal resonator 10 side, and the terminal 60 is directly connected to the substrate 30 using the insulating connection material 82 on the substrate 30 side.

Resonation Device

Third Embodiment

Then, a third embodiment of the invention will be explained with reference to FIG. 5. The third embodiment is characterized in the point that such bend of the terminals 60 as in the first embodiment and the second embodiment is eliminated by keeping a gap between the quartz crystal resonator 10 and the substrate 30 using the thickness of the intermediate member 70.

Figure 5:
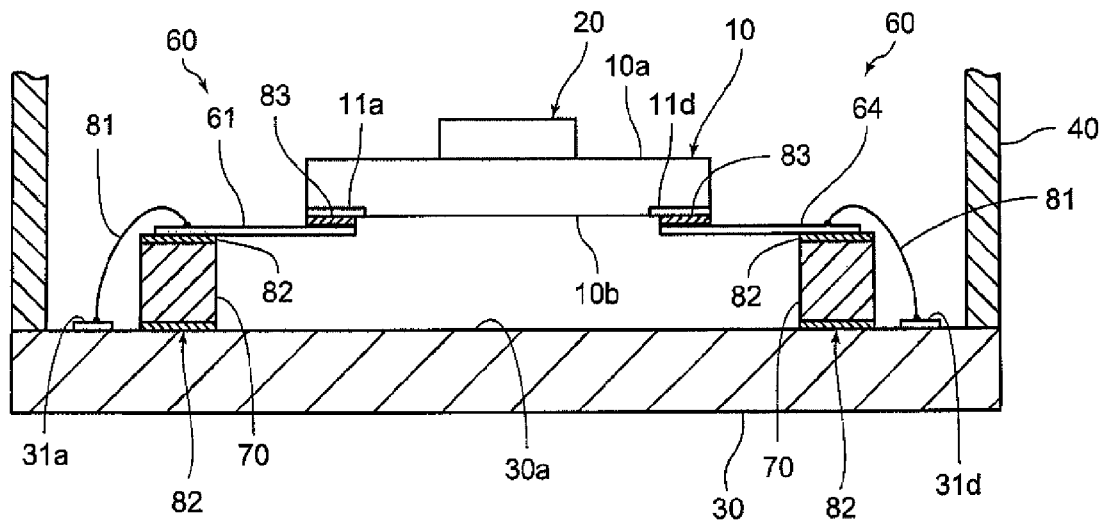
FIG. 5 is a partial cross-sectional view showing a connection/fixation structure between a quartz crystal resonator and a substrate according to a third embodiment of the invention.

FIG. 5 is a partial cross-sectional view showing a connection/fixation structure between the quartz crystal resonator 10 and the substrate 30 according to the third embodiment. It should be noted that FIG. 5 shows the position corresponding to the A-A cut surface in FIG. 1. As shown in FIG. 5, the intermediate members 70 are disposed on the principal surface 30a of the substrate 30. As a configuration of the intermediate members 70, it is possible to adopt the configuration similar to the configuration of the first embodiment except the thickness different from that of the intermediate members 70 of the first embodiment. For example, the intermediate members 70 can be disposed on the four corners of the quartz crystal resonator 10, or can be integrated to form a rectangular frame shape. However, the thickness of the intermediate members 70 is set so that there can be kept the distance comparable with the gap between the quartz crystal resonator 10 and the substrate 30 in the description of the first embodiment and the second embodiment.

It is assumed that the material of the intermediate members 70 is the same as that of the intermediate members 70 in the first embodiment, and is lower in thermal conductivity than the terminal 60. The intermediate members 70 are each connected to the principal surface 30a of the substrate 30 with the insulating connection material 82. The terminals 60 (the terminals 61, 64 are shown in FIG. 5) are each a metal member without a bend. One ends of the terminals 60 are connected respectively to the connecting electrodes 11 (the connecting electrodes 11a, 11d are shown in FIG. 5) with the electrically-conductive connection material 83 on the quartz crystal resonator 10 side, and the other ends are connected respectively to the intermediate members 70 with the insulating connection material 82. The terminals 61, 64 are connected respectively to the connecting electrodes 31a, 31d with the metal wires 81. In this structure, the connecting electrodes 11 (the connecting electrodes 11a, 11d are shown in FIG. 5) of the quartz crystal resonator element extend on the reverse surface 10b of the quartz crystal resonator 10.

In the structure of the third embodiment, the terminals 60 and the substrate 30 are connected to each other with the heat-insulating layer having the three-layer structure, which is obtained by stacking the insulating connection material 82, the intermediate member 70, and the insulating connection material 82 in this order from the principal surface 30a, intervening therebetween while keeping the gap between the quartz crystal resonator 10 and the substrate 30 due to the thickness of the intermediate members 70. Therefore, the heat is difficult to be transferred between the quartz crystal resonator 10 and the substrate 30.

Further, since the terminals 60 do not have a bend, it becomes easy to manufacture the terminals 60. Further, in the case of connecting the terminals 60 to the substrate 30 in the state in which the quartz crystal resonator 10 and the terminals 60 are connected to each other, since the posture of the quartz crystal resonator 10 is stabilized, there is an advantage that the connection operation becomes easy.

The third embodiment described above is not limited to the structure shown in FIG. 5, but can be modified.

For example, although not shown in the drawings, it is also possible to adopt a structure in which the quartz crystal resonator 10 and the terminals 60 are connected to each other with the insulating connection material 82, and the electrical connection between the terminals 60 and the quartz crystal resonator 10 is achieved by the metal wires 81.

Further, it is also possible to adopt a configuration in which the arrangement of the constituents is kept as shown in FIG. 5, the terminals 60 are bent so as to connect end portions of the terminals 60 to the principal surface 10a of the quartz crystal resonator 10 similarly to the case of the first embodiment.

Resonation Device

Fourth Embodiment

Then, a fourth embodiment of the invention will be explained with reference to FIGS. 6A and 6B. The fourth embodiment is characterized in the point that the quartz crystal resonator 10 and the substrate 30 are electrically connected to each other with the electrically-conductive adhesive 83a. The explanation will be presented showing the terminal 62 among the four terminals 60 as an example based on the case of taking the first embodiment as a base configuration.

Figure 6A:
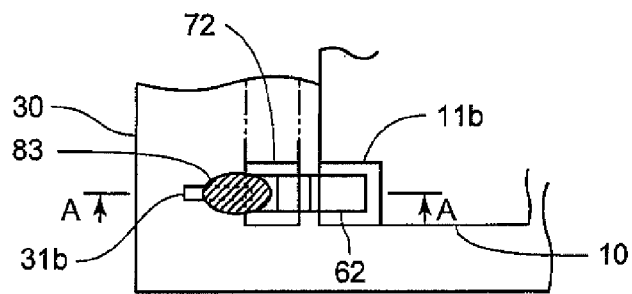
Figure 6B:
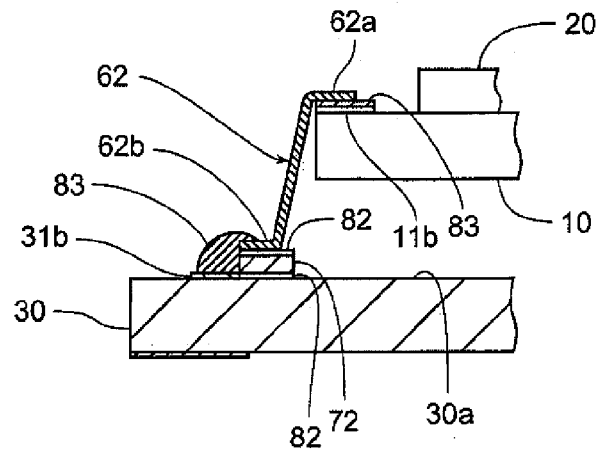

FIGS. 6A and 6B are diagrams showing a connection structure between the terminal 62 and the substrate 30 according to the fourth embodiment, wherein FIG. 6A is a partial plan view, and FIG. 6B is a partial cross-sectional view showing an A-A cut surface in FIG. 6A.

As shown in FIGS. 6A and 63, the connection/fixation structure with the terminal 62 on the quartz crystal resonator 10 side is substantially the same as in the first embodiment, and the fixation end section 62a of the terminal 62 is electrically connected to the connecting electrode 11b of the quartz crystal resonator 10 with the electrically-conductive connection material 83. On the other hand, on the substrate 30 side, the intermediate member 72 is connected with the insulating connection material 82, and further, the fixation end section 62b of the terminal 62 is connected to the intermediate member 72 with the insulating connection material 82. It should be noted that the intermediate member 72 and the insulating connection material 82 can be formed of the same member, and formation of the intermediate member 72 and connection of the fixation end section 62b to the principal surface 30a of the substrate 30 can be performed at the same time.

The connecting electrode 31b provided to the substrate 30 and the terminal 62 are electrically connected to each other with the electrically-conductive adhesive 83a. Since the mechanical holding of the quartz crystal resonator 10 is achieved by the terminal 62, within the range in which the connecting electrode 31b can electrically be connected to the terminal 62, the smaller the area of the connecting electrode 31b is the better. For example, it is possible to set the cross-sectional area to be comparable with that of the metal wire 81 described above.

By using an electrically-conductive epoxy adhesive or the like as the electrically-conductive adhesive 83a, applying the electrically-conductive adhesive 83a so as to straddle the fixation end section 62b and the connecting electrode 31b using a dispenser or the like, and solidifying the electrically-conductive adhesive 83a by heating, the electrical connection between the terminal 62 and the substrate 30 can be achieved.

In the configuration of the fourth embodiment, the intermediate member 72 is made to intervene between the substrate 30 and the terminal 62, and is connected to each of the substrate 30 and the terminal 62 using the insulating connection material 82 similarly to the case of the first embodiment. Further, the electrical connection between the quartz crystal resonator 10 and the substrate 30 is achieved by the electrically-conductive connection material 83 and the electrically-conductive adhesive 83a.

Even in the case of using the electrically-conductive adhesive 83a, by decreasing the cross-sectional area (e.g., the width of the electrode) of the connecting electrode 31b within the range in which the electrical connection to the terminal 62 can be achieved, the heat transfer in the electrical connection section can be suppressed. In other words, it is possible to inhibit the heat of the quartz crystal resonator 10 from being released to the substrate 30 via the terminal 62, and the heat from the outside from being transferred to the quartz crystal resonator 10 via the terminal 62.

It should be noted that in the fourth embodiment, it is also possible to adopt the structure in which the heat-insulating layer is made to intervene also on the quartz crystal resonator 10 side similarly to the case of the second embodiment (see FIG. 4), the heat-insulating layer having the three-layer structure composed of the insulating connection material 82, the intermediate member 75, and the insulating connection material 82 stacked on each other in this order from the principal surface 10a.

It should be noted that although in the present embodiment, the electrical connection between the fixation end section 62b and the connecting electrode 31b is achieved using the electrically-conductive adhesive 83a, it is also possible to apply a solder paste instead of the electrically-conductive adhesive using a dispenser or the like, and then heat the solder paste to be fixed.

Resonation Device

Fifth Embodiment

Then, a fifth embodiment of the invention will be explained with reference to FIGS. 7A through 7C. The fifth embodiment is characterized in the point that the intermediate members 70 are each provided with a through hole for the electrical connection while adopting the structure of the forth embodiment as a base structure. Therefore, the terminal 62 among the four terminals 60 will be explained as a representative example focusing mainly on the points different from the fourth embodiment.

Figure 7A:
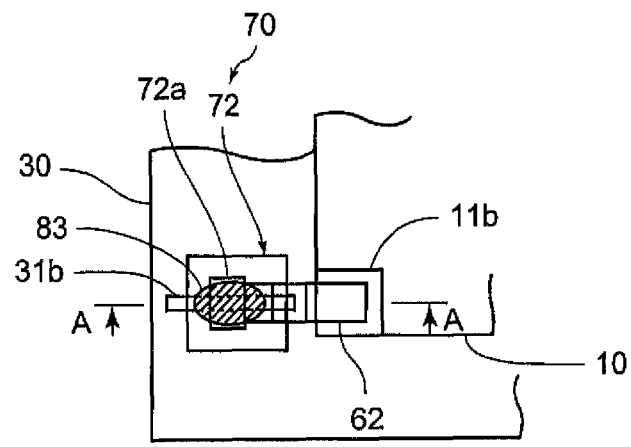
Figure 7B:
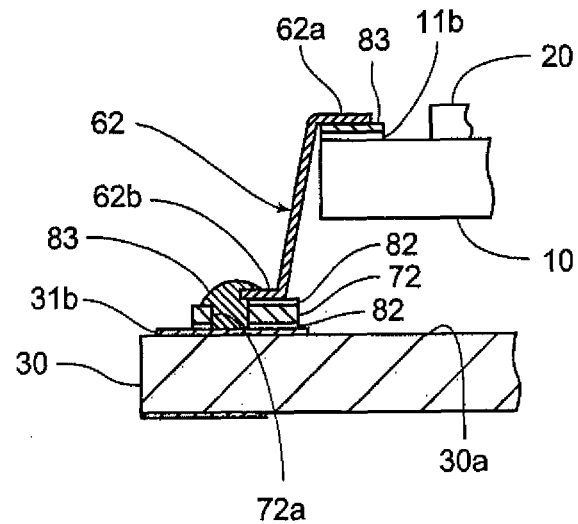
Figure 7C:
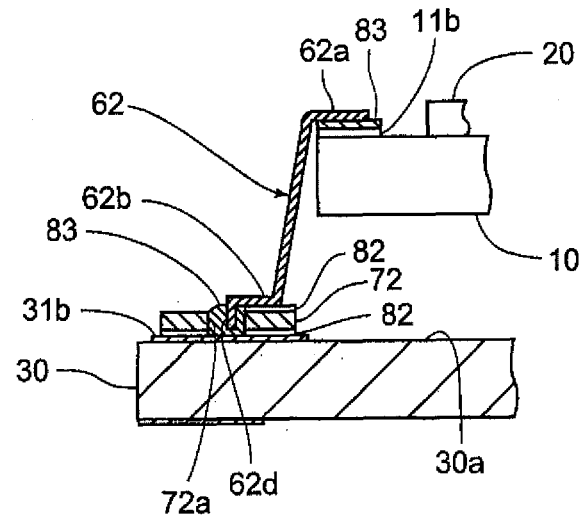

FIGS. 7A through 7C are diagrams showing a connection structure between the terminal 62 and the substrate 30 according to the fifth embodiment, wherein FIG. 7A is a partial plan view, FIG. 7B is a partial cross-sectional view showing an A-A cut surface in FIG. 7A, and FIG. 70 is a partial cross-sectional view showing a modified example of the fifth embodiment.

As shown in FIGS. 7A and 7B, the intermediate member 72 is provided with the through hole 72a penetrating in the thickness direction of the intermediate member 72. A tip portion of the fixation end section 62b of the terminal 62 is disposed to a position slightly projected from the edge of the through hole 72a (partially blocking the through hole 72a). The insulating connection material 82 disposed on the substrate 30 is provided with a hole penetrating so that the connecting electrode 31b can be seen through the through hole 72a, and the insulating connection material 82 provided to the terminal 62 is disposed only on the connection section of the fixation end section 62b. On the substrate 30 side, the intermediate member 72 is connected with the insulating connection material 82, and further, the fixation end section 62b of the terminal 62 is connected to the intermediate member 72 with the insulating connection material 82. The electrically-conductive connection material 83 is applied so as to straddle the inside of the through hole 72a and the fixation end section 62b, and then heated to be solidified, and thus, the electrical connection between the terminal 62 and the connecting electrode 31b can be achieved.

In the configuration of the fifth embodiment, the intermediate member 72 is made to intervene between the substrate 30 and the terminal 62, and the substrate 30 and the terminal 62 are electrically connected to each other using the electrically-conductive connection material 83 such as an electrically-conductive adhesive or a solder paste similarly to the case of the fourth embodiment. In the fifth embodiment, the intermediate member 72 is provided with the through hole 72a to thereby prevent the electrically-conductive connection material 83 from flowing out to the outer peripheral edge of the through hole 72a, and thus, the connection area between the electrically-conductive connection material 83, and the connecting electrode 31b and the substrate 30 is limited. According to this configuration, the heat transfer between the terminals 60 and the substrate 30 via the electrically-conductive connection material 83 can be suppressed.

Modified Example of Fifth Embodiment

Then, a modified example of the fifth embodiment will be explained with reference to FIG. 7C. Similarly to the fifth embodiment, the intermediate member 72 is provided with the through hole 72a penetrating in the thickness direction of the intermediate member 72. The tip portion 62d of the fixation end section 62b of the terminal 62 is bent to be inserted into the through hole 72a. The insulating connection material 82 is also provided with a hole penetrating so that the connecting electrode 31b can be seen through the through hole 72a. The electrically-conductive connection material 83 is applied so as to sufficiently adhere to the tip portion 62d inside the through hole 72a, and then heated to be solidified, and thus, the electrical connection between the terminal 62 and the connecting electrode 31b can be achieved.

The application range of the electrically-conductive connection material 83 can be limited by applying the electrically-conductive adhesive to the inside of the through hole 72a with a dispenser or the like in the case of using the electrically-conductive adhesive as the electrically-conductive connection material 83, or by applying a solder paste to the inside of the through hole 72a with a dispenser or the like and then heating to melt and then cooling to solidify the solder paste in the case of the solder connection.

By providing the tip portion 62d thus bent to the terminal 62, it becomes possible to confine the application range of the electrically-conductive connection material 83 to the inside of the through hole 72a, and thus the connection areas between the electrically-conductive connection material 83, and the connecting electrode 31b and the terminal 62 can be limited to small sizes. According to this configuration, the heat transfer between the terminals 60 and the substrate 30 via the electrically-conductive connection material 83 can be suppressed.

Resonation Device

Sixth Embodiment

Then, a sixth embodiment of the invention will be explained with reference to the drawing. The sixth embodiment is characterized in the point that the intermediate members 70 and the fixation end sections of the terminals 60 are each provided with a through hole for the electrical connection while adopting the structure of the forth embodiment as a base structure. Therefore, the terminal 62 among the four terminals 60 will be explained as a representative example focusing mainly on the points different from the fourth embodiment.

Figure 8:
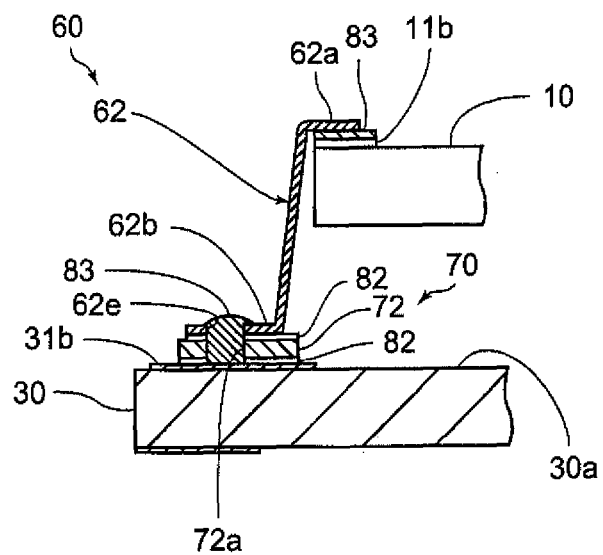
FIG. 8 is a partial cross-sectional view showing a connection structure between a terminal and a substrate according to a sixth embodiment of the invention.

FIG. 8 is a partial cross-sectional view showing a connection structure between the terminal 62 and the substrate 30 according to the sixth embodiment. The intermediate member 72 is provided with the through hole 72a penetrating in the thickness direction of the intermediate member 72, and the fixation end section 62b of the terminal 62 is also provided with a through hole 62e penetrating in the thickness direction of the fixation end section 62b. Since the insulating connection material 82 disposed on each of the substrate 30 and the terminal 62 is provided with a through hole penetrating through the insulating connection material 82 in addition to the through hole 62e and the through hole 72a, there is obtained the state in which the connecting electrode 31b can be seen from the fixation end section 62b. On the substrate 30 side, the intermediate member 72 is connected with the insulating connection material 82, and further, the fixation end section 62b of the terminal 62 is connected to the intermediate member 72 with the insulating connection material 82. The electrically-conductive connection material 83 is applied to the inside of the through hole 72a, the inside of the through hole 62e of the fixation end section 62b, and the peripheral edge of the through hole 62e, and then heated to be solidified, and thus, the electrical connection between the terminal 62 and the connecting electrode 31b can be achieved.

By adopting such a configuration, by providing the through hole 72b to the intermediate member 72 and providing the through hole 62e to the terminal 62, the electrically-conductive connection material 83 can be prevented from flowing out to the outer periphery of the through hole 72a. Further, by confining the electrically-conductive connection material 83 to the inside of the through hole 72a, the contact area between the electrically-conductive connection material 83 and the terminal 62 can be limited to a small value. According to this configuration, the heat transfer between the terminals 60 and the substrate 30 via the electrically-conductive connection material 83 can be suppressed.

It should be noted that in the first through sixth embodiments described above, the quartz crystal resonator 10 and the substrate 30 are connected to each other with the terminals 60 and the intermediate members 70 low in thermal conductivity intervening therebetween to thereby inhibit the heat from being transferred between the quartz crystal resonator 10 and the substrate 30, and the quartz crystal oscillator 1 with the simplified structure can be realized applying the technical concept. The above will be explained hereinafter as another embodiment.

Resonation Device

Seventh Embodiment

Then, a seventh embodiment of the invention will be explained with reference to the drawing. The seventh embodiment is characterized in the point that a pedestal 76 corresponding to the intermediate members 70 in the first through sixth embodiments is used as a device for connecting the quartz crystal resonator 10 to the substrate 30.

Figure 9:
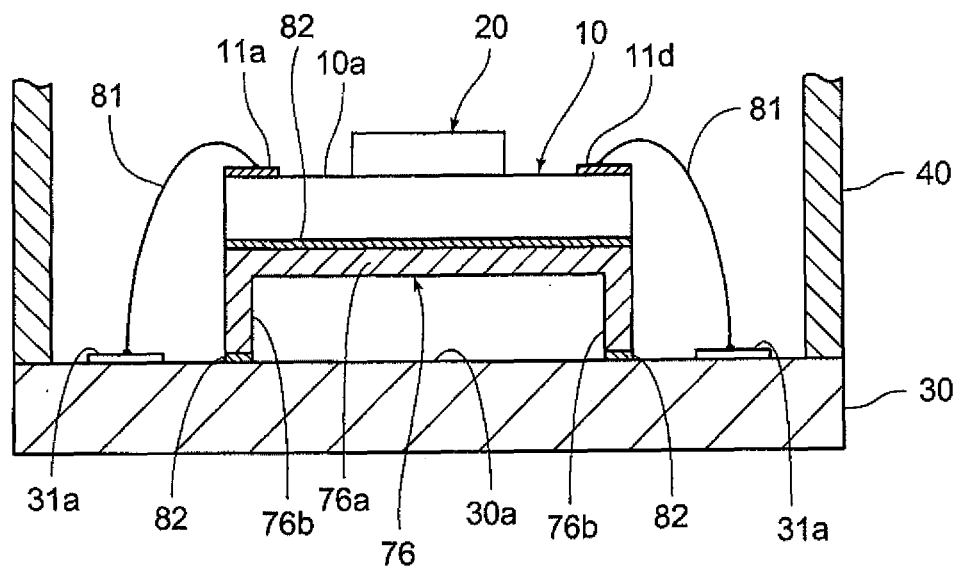
FIG. 9 is a partial cross-sectional view showing a quartz crystal oscillator according to a seventh embodiment of the invention.

FIG. 9 is a partial cross-sectional view showing the quartz crystal oscillator 1 according to the seventh embodiment. It should be noted that FIG. 9 shows the cross-sectional view corresponding to the same position as the position of the A-A cut surface in FIG. 1. As shown in FIG. 9, the quartz crystal resonator 10 is connected to the substrate 30 with the insulating connection material 82 in the state of being connected to the pedestal 76 with the insulating connection material 82.

The pedestal 76 is provided with a base section 76a having a quadrangular planar shape roughly the same as that of the quartz crystal resonator 10, four post sections 76b respectively projected from the four corners of the base section 76a toward the substrate 30. The pedestal 76 is formed of a material lower in thermal conductivity than metal and having electrical insulation property such as glass, glass epoxy resin, ceramics such as alumina, or polyimide resin. The thickness of the post section 76b is preferably made thinner within a range in which the fixation strength can be kept. The pedestal 76 is connected to the principal surface 30a of the substrate 30 at the tip portions of the post sections 76b via the insulating connection material 82.

The heating element 20 is connected to a central portion of the principal surface 10a of the quartz crystal resonator 10, and the connecting electrodes 11a through 11d (the connecting electrodes 11a, 11d are shown in FIG. 9) are disposed at four corners of the principal surface 10a similarly to the first embodiment. The distance between the base section 76a of the pedestal 76 and the principal surface 30a of the substrate 30 corresponds to the gap between the quartz crystal resonator 10 and the substrate 30 in the first embodiment (see FIG. 2). The principal surface 30a of the substrate 30 is provided with the connecting electrodes 31a through 31d (the connecting electrodes 31a, 31d are shown in FIG. 9). Further, the connecting electrode 11a and the connecting electrode 31a, and the connecting electrode 11d and the connecting electrode 31d, are electrically connected to each other with metal wires 81, respectively. The electrical connection structure between the heating element 20 and the substrate 30 and the structure of the 11d member 40 are the same as those of the first embodiment, and therefore, the explanation thereof will be omitted.

In such a structure, the quartz crystal resonator 10 is connected to the substrate 30 via the pedestal 76 as an intermediate member, and the electrical connection between the quartz crystal resonator 10 and the substrate 30 is achieved by the metal wires 81. Therefore, the heat is made difficult to be transferred between the quartz crystal resonator 10 and the substrate 30.

Although in the first through seventh embodiments described hereinabove, the explanation is presented citing the quartz crystal oscillator 1, which uses the quartz crystal resonator 10 as the resonator, as an example, the invention can be adapted into a resonator using a piezoelectric element other than the quartz crystal, a resonator having a piezoelectric element formed on the surface of the base member, a MEMS (Micro Electro Mechanical System) resonator using a semiconductor substrate, and so on. Further, the invention can also be applied to an electronic device having a characteristic varying due to the temperature variation other than resonators.

Electronic Apparatus

Although in each of the embodiments described above, the explanation is presented citing the quartz crystal oscillator 1 as an example of the resonation device, it is possible to adapt the invention to other resonation devices besides the quartz crystal oscillator 1. For example, there can be cited an angular velocity sensor, an acceleration sensor, a tilt sensor, and so on using the resonator as a physical quantity detection element. Most resonation devices use a method of measuring the physical quantity to be detected using the fact that the resonant frequency of the resonator incorporated therein varies in accordance with the level of the physical quantity. As described above, since the resonant frequency of the resonator has a temperature characteristic, by keeping the resonator at constant temperature using the heating element, a variety of types of electronic apparatuses performing accurate physical quantity measurement can be provided.

Figure 10:
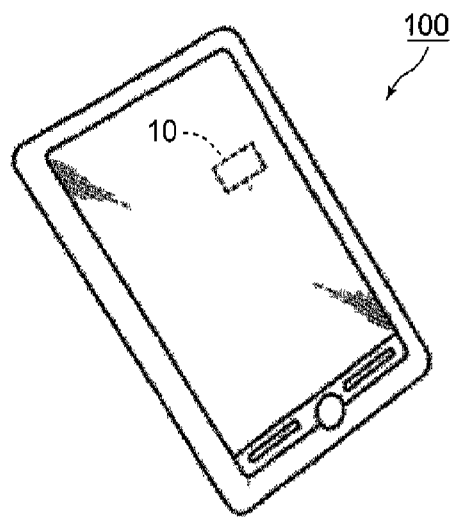
FIG. 10 is a perspective view showing an example of an appearance of an electronic apparatus according to an application example.

For example, FIG. 10 shows a schematic diagram of an electronic apparatus (a sophisticated mobile terminal 100) equipped with the quartz crystal oscillator 1 according to the present embodiment. In the sophisticated mobile terminal 100 shown in FIG. 10 incorporates, for example, an angular velocity sensor (not shown) for detecting the posture of the sophisticated mobile terminal 100, and the quartz crystal oscillator 1 according to the present embodiment can be used as a clock source for working the control mechanism of the angular velocity sensor. As described above, by using the quartz crystal oscillator 1 according to the present embodiment, a highly reliable electronic apparatus having resistance to an external impact, vibration, and so on can be realized.

It is possible to adopt a variety of electronic apparatuses as the electronic apparatus 100 equipped with the resonation device according to the present embodiment. There can be cited, for example, a personal computer (e.g., a mobile type personal computer, a laptop personal computer, and a tablet personal computer), a mobile terminal such as a cellular phone, a digital still camera, an inkjet ejection device (e.g., an inkjet printer), a storage area network apparatus such as a router or a switch, a local area network apparatus, a television set, a video camera, a video cassette recorder, a car navigation system, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments, gauges (e.g., gauges for cars, aircrafts, and boats and ships), a flight simulator, a head-mount display, a motion tracer, a motion tracker, a motion controller, and a pedestrian dead reckoning (PDR) system.

Moving Object

Figure 11:
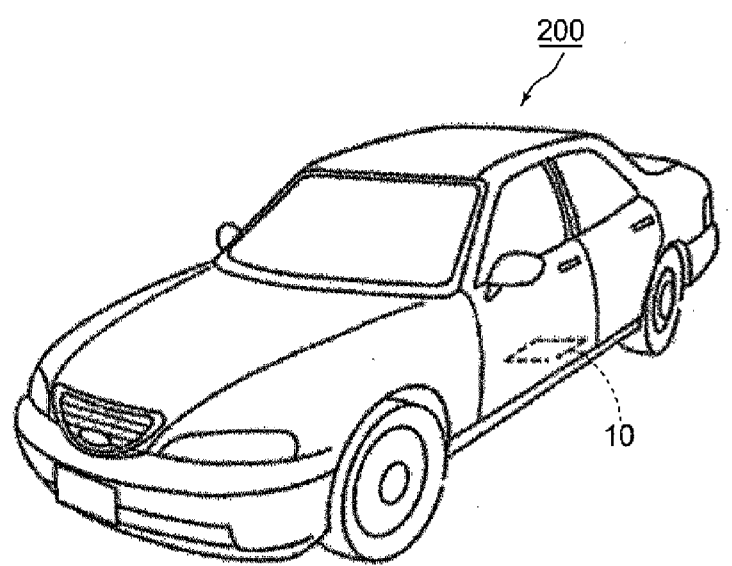
FIG. 11 is a perspective view showing an example of an appearance of a moving object according to an application example.

The resonation device explained hereinabove can be installed in a variety of moving objects. For example, FIG. 11 shows a schematic diagram of a moving object (a vehicle 200) equipped with the quartz crystal oscillator 1 according to the present embodiment. For example, in the vehicle 200 shown in FIG. 11 incorporates an angular velocity sensor (not shown) for detecting the posture, and the quartz crystal oscillator 1 according to the present embodiment can be used as a clock source for working the control mechanism of the angular velocity sensor. As described above, by using the quartz crystal oscillator 1 according to the present embodiment, a highly reliable electronic apparatus having resistance to an external impact, vibration, and so on can be realized.

It is possible to adopt a variety of moving objects as the moving object 200 equipped with the quartz crystal oscillator 1 according to the present embodiment. For example, a vehicle (including an electric vehicle), an aircraft such a jet plane or a helicopter, a ship, a rocket, and an artificial satellite can be cited.

By installing the quartz crystal oscillator 1 described above in such a moving object as described above, the resonator can be kept at predetermined temperature with low power consumption, and therefore, there can be realized accurate mobile communication equipment and transmission communication equipment provided with such high reliability that the frequency does not vary despite the variation in external temperature.

The entire disclosure of Japanese Patent Application No. 2013-71575, filed Mar. 29, 2013 is expressly incorporated by reference herein.

What is claimed is:

1. A resonation device comprising:
a substrate;
a resonator;
a heating element adapted to heat the resonator;
a terminal adapted to connect the resonator and the substrate to each other; and
an intermediate member lower in thermal conductivity than the terminal disposed at least one of between the resonator and the terminal, and between the terminal and the substrate.

2. The resonation device according to claim 1, wherein
the intermediate member is an insulating member, and
the resonator and the substrate are electrically connected to each other with the terminal and an electrically-conductive connection material lower in thermal conductivity than the terminal.

3. The resonation device according to claim 1, wherein
the intermediate members are respectively disposed between the resonator and the terminal, and between the terminal and the substrate.

4. The resonation device according to claim 2, wherein
the intermediate members are respectively disposed between the resonator and the terminal, and between the terminal and the substrate.

5. The resonation device according to claim 1, wherein
the intermediate member is lower in thermal conductivity than the resonator in a case in which the intermediate member is disposed between the resonator and the terminal, and
the intermediate member is lower in thermal conductivity than the substrate in a case in which the intermediate member is disposed between the terminal and the substrate.

6. The resonation device according to claim 2, wherein
the intermediate member is lower in thermal conductivity than the resonator in a case in which the intermediate member is disposed between the resonator and the terminal, and
the intermediate member is lower in thermal conductivity than the substrate in a case in which the intermediate member is disposed between the terminal and the substrate.

7. The resonation device according to claim 3, wherein
the intermediate members are lower in thermal conductivity than at least one of the substrate and the resonator.

8. The resonation device according to claim 4, wherein
the intermediate members are lower in thermal conductivity than at least one of the substrate and the resonator.

9. The resonation device according to claim 2, wherein
the electrically-conductive connection material is a metal wire.

10. The resonation device according to claim 2, wherein the electrically-conductive connection material is an electrically-conductive adhesive.

11. An electronic apparatus comprising:
the resonation device according to claim 1.

12. A moving object comprising:
the resonation device according to claim 1.

* * * * *